United States Patent
Fang et al.

(10) Patent No.: US 8,143,167 B2
(45) Date of Patent: Mar. 27, 2012

(54) FABRICATION PROCESSES FOR FORMING DUAL DEPTH TRENCHES USING A DRY ETCH THAT DEPOSITS A POLYMER

(75) Inventors: Xiaolong Fang, Boise, ID (US); Ramakanth Alapati, Boise, ID (US); Tuman E. Allen, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 118 days.

(21) Appl. No.: 12/396,952

(22) Filed: Mar. 3, 2009

(65) Prior Publication Data
US 2010/0062580 A1  Mar. 11, 2010

Related U.S. Application Data

(62) Division of application No. 11/409,356, filed on Apr. 20, 2006, now abandoned.

(51) Int. Cl.
*H01L 21/311* (2006.01)

(52) U.S. Cl. .. 438/695; 438/696; 438/700; 257/E21.548

(58) Field of Classification Search ................. 438/424, 438/427, 695, 696, 700–702, 713, 725, 780; 257/E21.546, E21.548
See application file for complete search history.

(56) References Cited

U.S. PATENT DOCUMENTS

| 5,275,965 | A | 1/1994 | Manning |
| 6,175,147 | B1 | 1/2001 | Akram |
| 6,437,417 | B1 | 8/2002 | Gilton |
| 6,583,060 | B2 | 6/2003 | Trivedi |
| 6,719,012 | B2 | 4/2004 | Doan et al. |
| 6,720,217 | B2 | 4/2004 | Kim et al. |
| 6,830,977 | B1 | 12/2004 | Jono et al. |
| 6,849,919 | B2 | 2/2005 | Sumino et al. |
| 6,894,354 | B2 | 5/2005 | Jono et al. |
| 6,982,207 | B2 | 1/2006 | Bai et al. |
| 6,995,095 | B2 * | 2/2006 | Yu ................... 438/750 |
| 7,078,286 | B1 * | 7/2006 | Mehta ............ 438/221 |
| 7,611,962 | B2 * | 11/2009 | Kwak ............. 438/424 |
| 2002/0033516 | A1 | 3/2002 | Choi et al. |
| 2002/0039843 | A1 * | 4/2002 | Ikeda et al. ........... 438/738 |
| 2002/0056886 | A1 | 5/2002 | Usui et al. |
| 2004/0002221 | A1 | 1/2004 | O'Donnell et al. |

(Continued)

FOREIGN PATENT DOCUMENTS
JP   2005294759 A * 10/2005

OTHER PUBLICATIONS

Non-final Office Action mailed Oct. 14, 2010, U.S. Appl. No. 12/117,391 filed May 8, 2008, first named inventor Michael A. Smith.

(Continued)

*Primary Examiner* — Matthew Landau
*Assistant Examiner* — Joseph C Nicely

(57) ABSTRACT

Trench isolation structures and methods to form same for use in the manufacture of semiconductor devices are described. The trench isolation structures are formed using several processing schemes that utilize disclosed dry etching processes to form a significant depth Δ between an array trench depth and a periphery trench depth. One etching method creates a trench delta depth utilizing a single dry etch step, while two other etching methods create a trench Δ depth by utilizing three dry etch steps.

29 Claims, 7 Drawing Sheets

U.S. PATENT DOCUMENTS

| | | |
|---|---|---|
| 2004/0014281 A1 | 1/2004 | Kim et al. |
| 2004/0023508 A1* | 2/2004 | Chinn et al. ................ 438/710 |
| 2004/0266136 A1 | 12/2004 | Jung et al. |
| 2005/0079722 A1* | 4/2005 | Yu ................................ 438/706 |
| 2005/0279998 A1 | 12/2005 | Cole et al. |
| 2006/0220171 A1 | 10/2006 | Choi et al. |
| 2006/0258098 A1* | 11/2006 | Lee ............................... 438/258 |
| 2007/0194402 A1* | 8/2007 | Sandhu et al. ................ 257/506 |
| 2009/0026586 A1* | 1/2009 | Anderson ...................... 257/623 |
| 2009/0176330 A1* | 7/2009 | Wilson et al. ................... 438/98 |

OTHER PUBLICATIONS

Final Office Action mailed Mar. 28, 2011, U.S. Appl. No. 12/117,391 filed May 8, 2008, first named inventor Michael A. Smith.

* cited by examiner

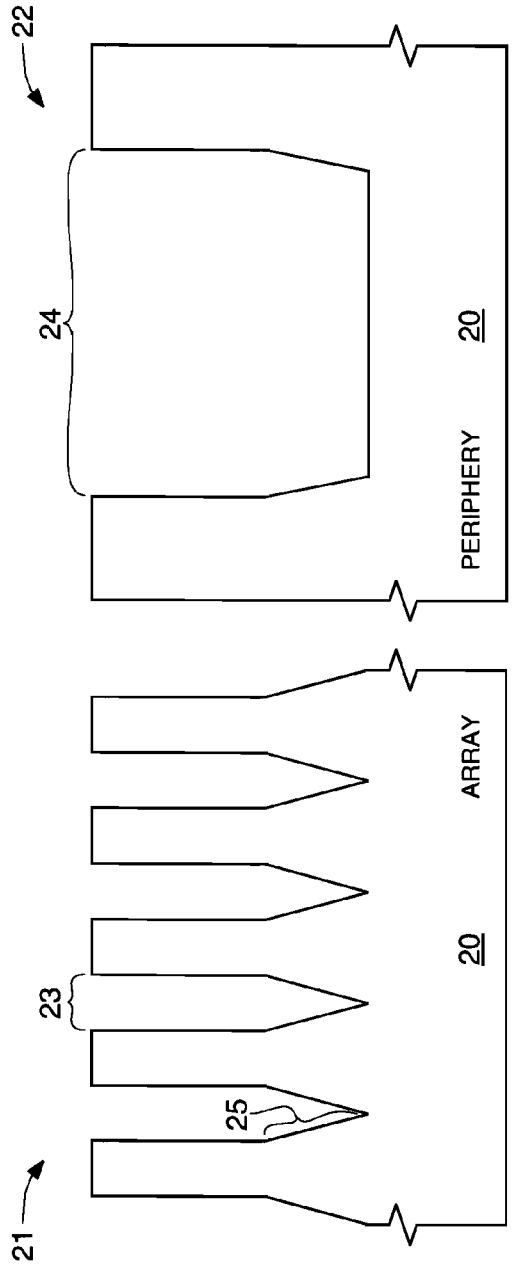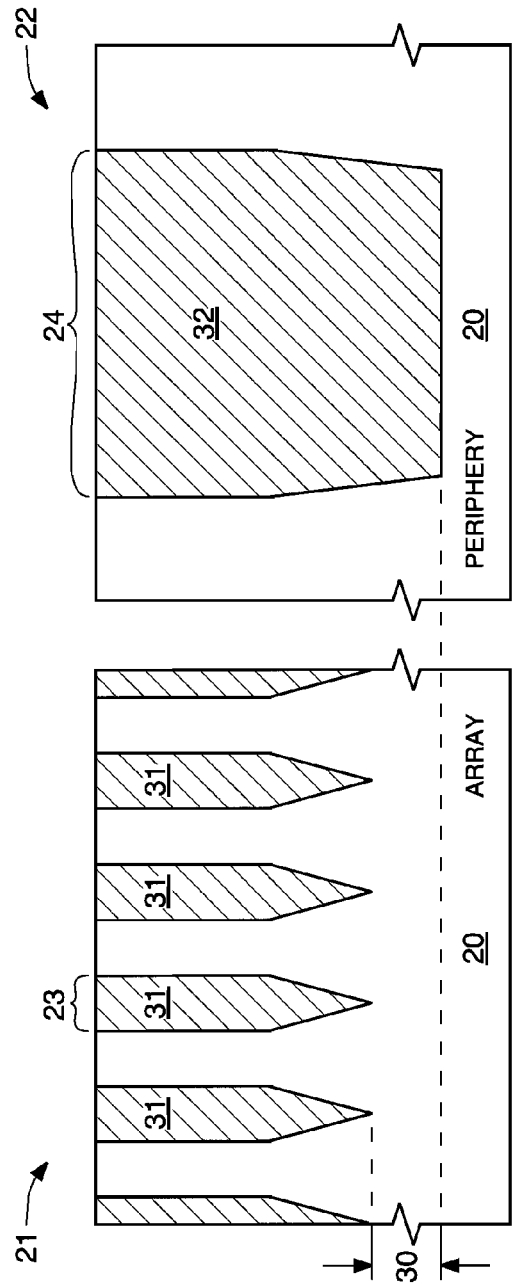

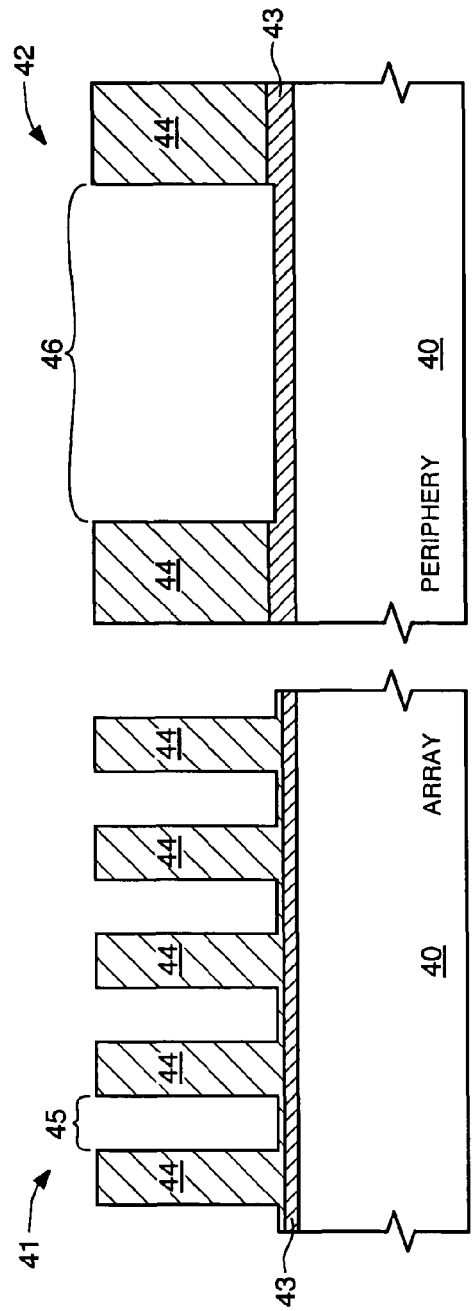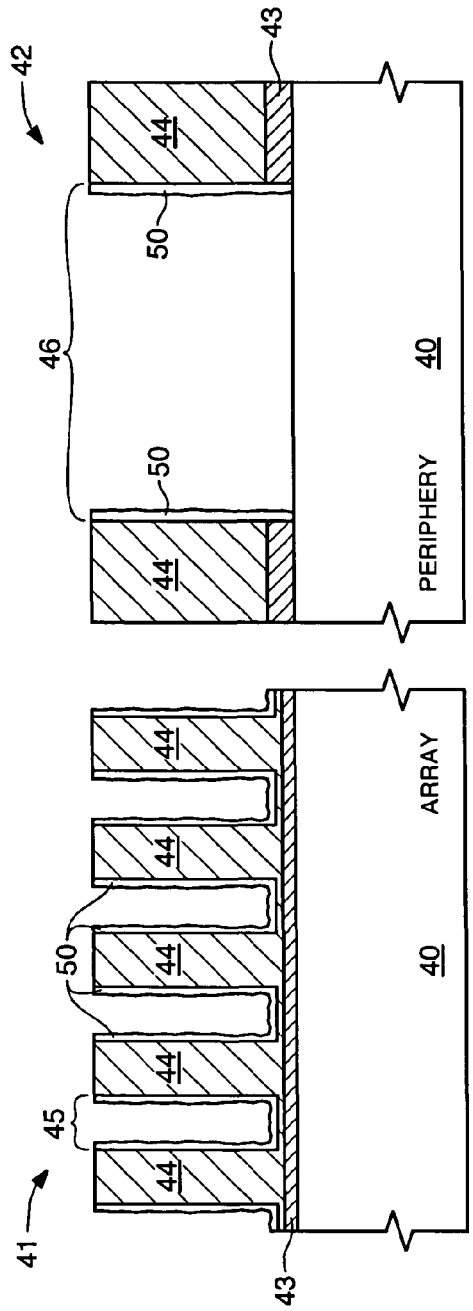

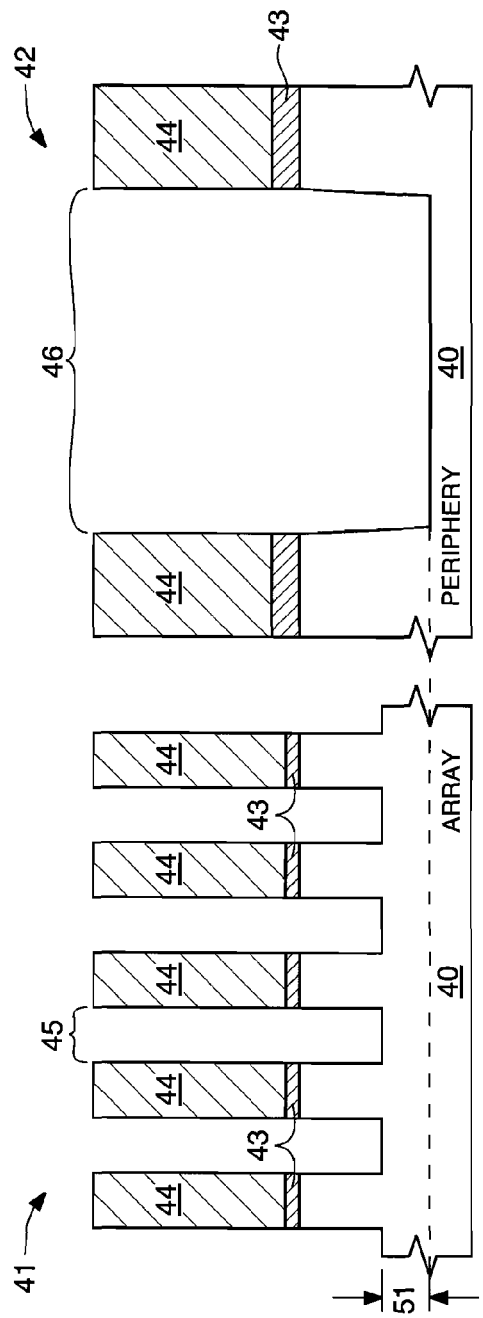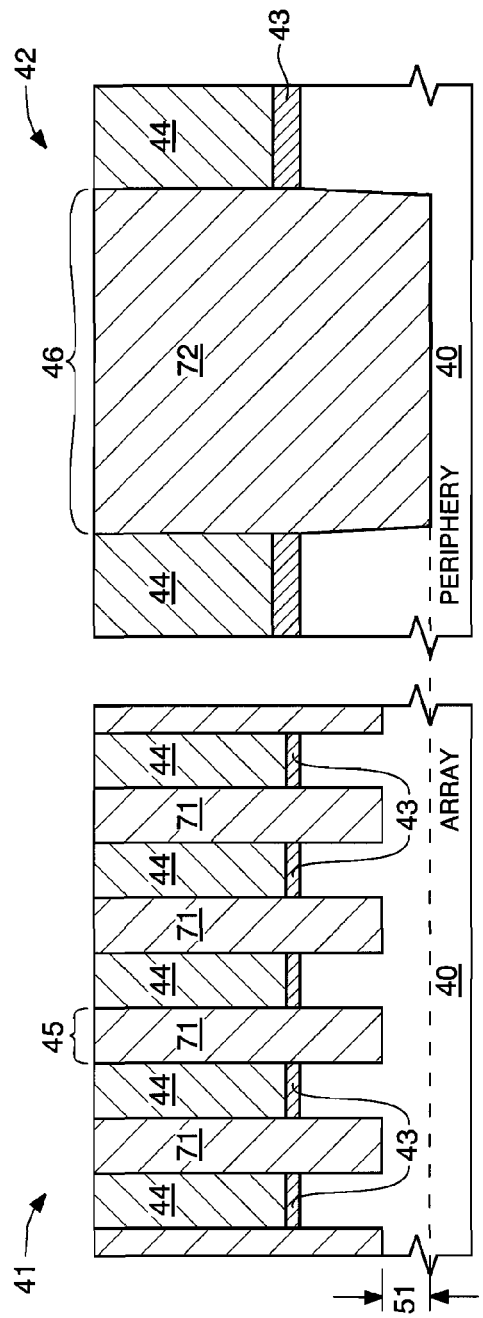

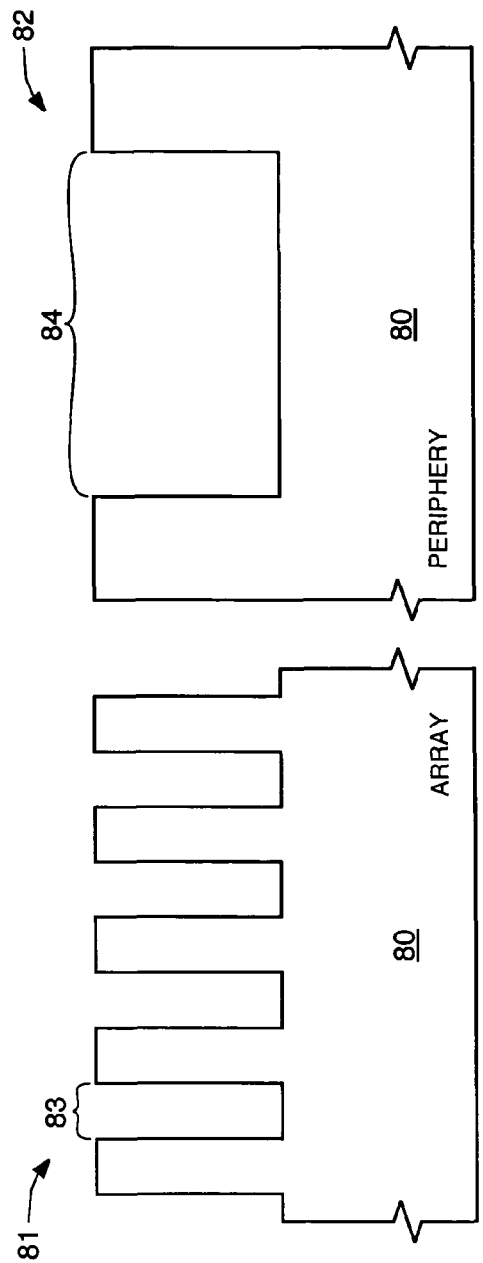
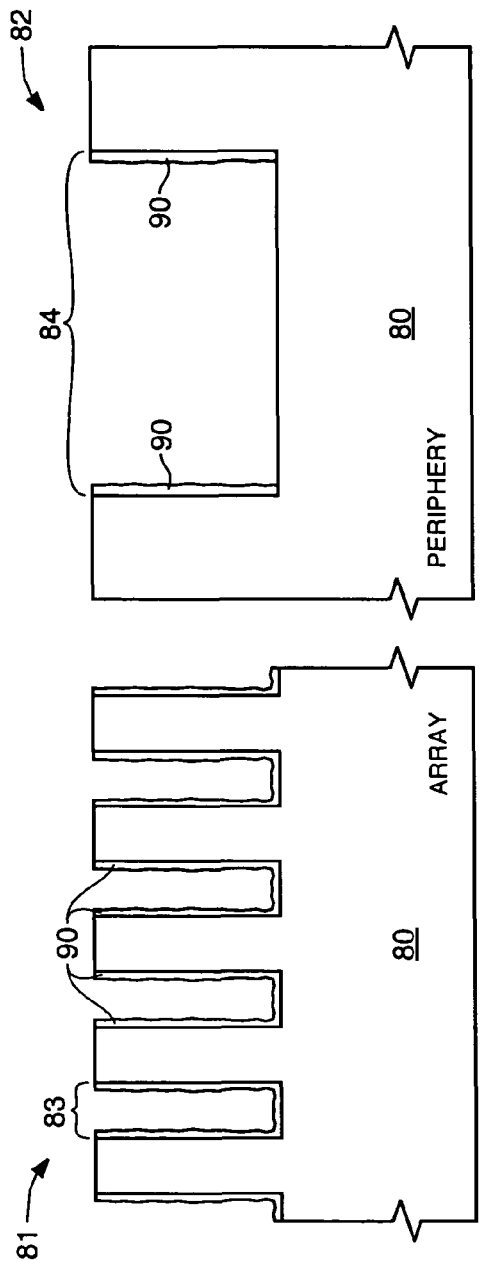

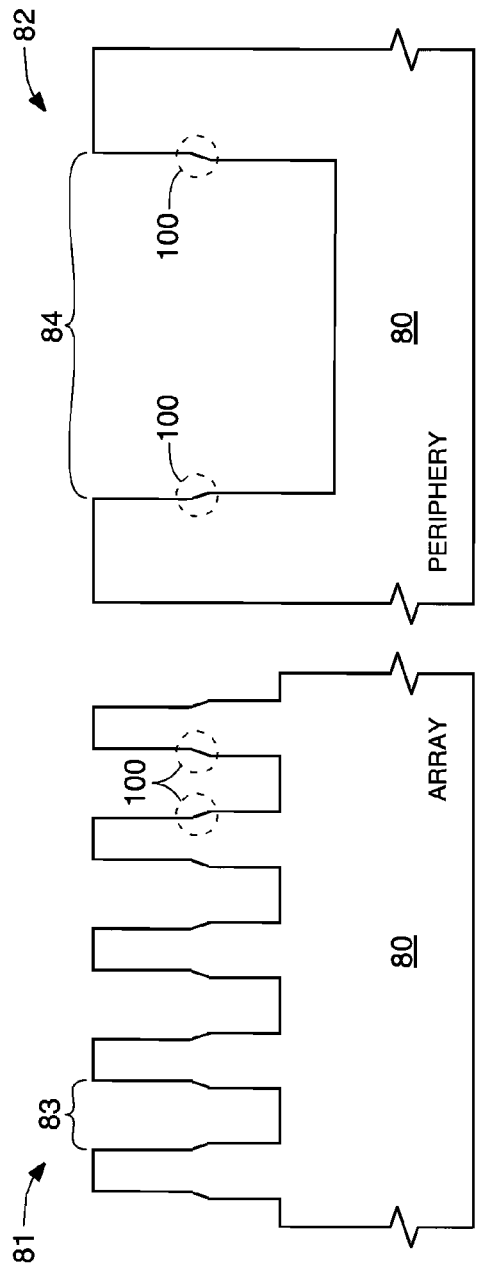
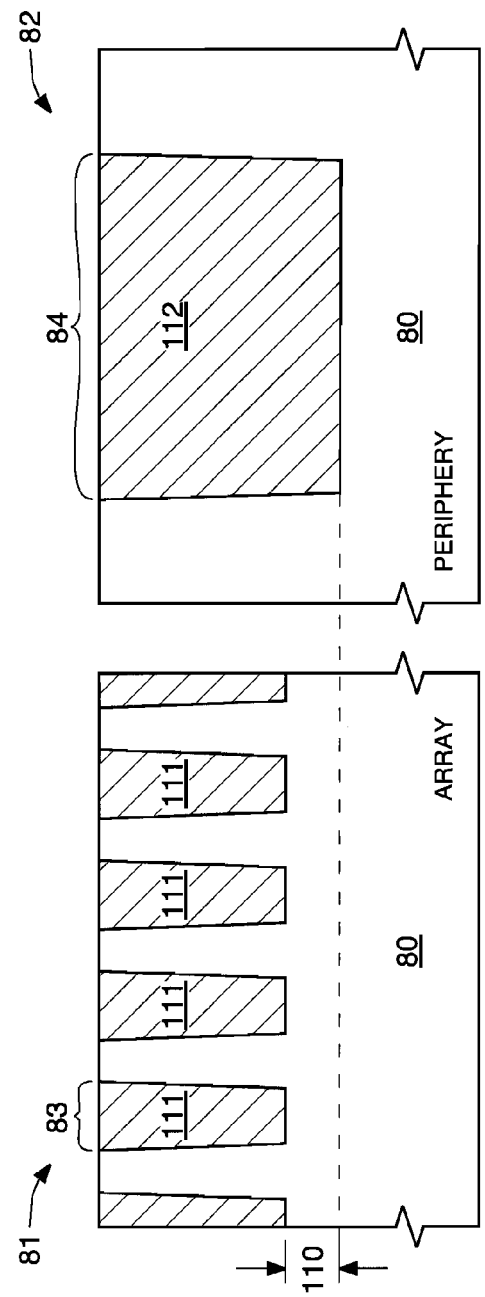

FABRICATION PROCESSES FOR FORMING DUAL DEPTH TRENCHES USING A DRY ETCH THAT DEPOSITS A POLYMER

This application is a divisional of application Ser. No. 11/409,356, filed on Apr. 20, 2006, now abandoned, the entire disclosure of which is hereby incorporated by reference.

FIELD OF THE INVENTION

This invention relates to semiconductor fabrication processing and, more particularly, to fabrication methods for forming dual depth trench isolation in semiconductor devices, such as semiconductor flash memory devices.

BACKGROUND OF THE INVENTION

Semiconductor devices, such as memory devices, use field effect transistors (FETs) to create the integrated circuits required during the fabrication of complimentary metal oxide semiconductor (CMOS) devices on a semiconductor wafer or other substrate. The fabrication of CMOS devices require advanced isolation techniques to create isolation between neighboring FETs.

One conventional isolation technique known as shallow trench isolation (STI) is used where a trench is etched into a silicon substrate and the trench is filled with an oxide insulator material and planarized. The STI then functions as isolation between subsequently formed FETs and provides many desirable circuit device properties.

However, the current STI techniques also possess some disadvantages. For example, FIG. 1 depicts a current STI dry etch process used to fabricate a flash device. FIG. 1 shows array section 10 and periphery section 11 on substrate 12. In array section 10, trenches 13 have been etched into substrate 12 and in periphery section 11, trenches 14 have been etched into substrate 12. At this point, the current technique is to form a mask over array section 10 and a subsequent etch step is performed on periphery section 11 to increase the depth of trenches 14. In this example, the resulting depth Δ between the depth of array trenches 12 and periphery trenches 14 is only approximately 380 Å and as indicated, to create the depth Δ between trenches 12 and 14 an additional mask step and etch step are required that increase production cost of the device and possibly limit the electrical properties of the device.

Accordingly, STI formation techniques are needed that will improve the electrical property of CMOS devices and also reduce production costs.

BRIEF DESCRIPTION OF THE DRAWINGS

FIG. 2 depicts a first exemplary implementation of the present invention showing a cross-sectional view of a semiconductor substrate having an array section and a periphery section with trenches formed therein where the side wall slope of the array trench is set such that a desired trench depth in the array section and a desired trench depth the periphery section are obtained.

FIG. 3 is a cross-sectional view following FIG. 2 depicting the resulting trenches after a dry etch step of the present invention is performed to create the desired trench depths in the array section and the periphery section.

FIG. 4 depicts a second exemplary implementation of the present invention showing a cross-sectional view of a semiconductor substrate having an array section and a periphery section with trenches formed therein after a first dry etch step is performed that stops at a polysilicon layer in the array section, but stops at a layer used as an etch stop layer in the periphery section.

FIG. 5 is a cross-sectional view following FIG. 4 taken after a second dry etch is performed to selectively etch oxide in the periphery section and, in turn, deposit a polymer on the silicon surfaces of the trenches in both the array and periphery sections.

FIG. 6 is a cross-sectional view following FIG. 5 taken after a conventional trench dry etch is performed to remove polymer and achieve a desired trench depth in the array section and a desired trench depth the periphery section.

FIG. 7 is a cross-sectional view of FIG. 6 depicting the resulting trenches after a conventional trench dry etch step is performed to create the desired trench depths in the array section and the periphery section.

FIG. 8 depicts a third exemplary implementation of the present invention showing a cross-sectional view of a semiconductor substrate having an array section and a periphery section with trenches formed therein at desired depths by a first dry etch step.

FIG. 9 is a cross-sectional view following FIG. 8 taken after a second dry etch is performed to increase the trench depth in both the array section and in the periphery section and, in turn, deposit a polymer on the silicon surfaces of the trenches in both the array and periphery sections.

FIG. 10 is a cross-sectional view following FIG. 9 showing a kink induced by the second dry etch step of FIG. 9.

FIG. 11 is a cross-sectional view of FIG. 10 depicting the resulting trenches after a specific break-through etch step is performed to remove any polymer deposited in the bottom of the trenches and to remove an induced kink shown in FIG. 10.

DETAILED DESCRIPTION OF THE INVENTION

In the following description, the terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but may be based on silicon-germanium, silicon-on-insulator, silicon-on-sapphire, germanium, or gallium arsenide, among others.

Figure 1:
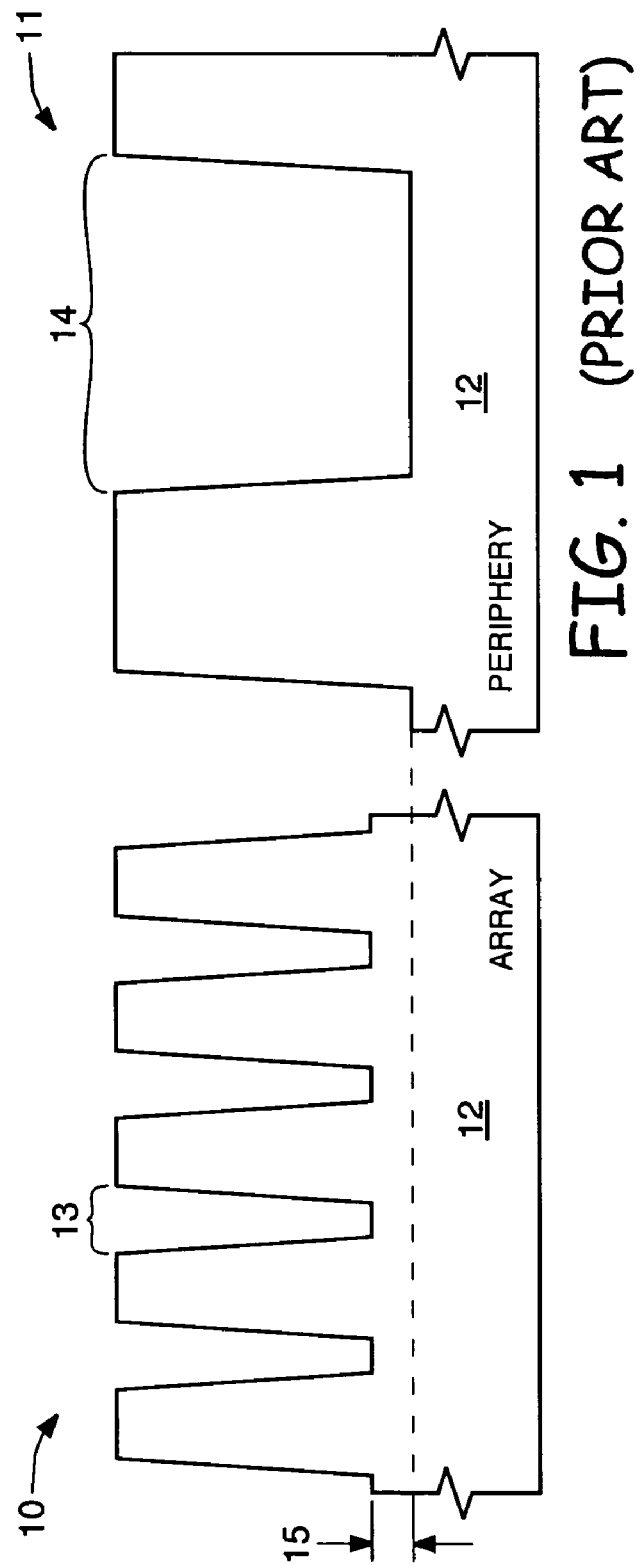
FIG. 1 is a cross-sectional view depicting a semiconductor substrate with trenches formed therein using a convention STI formation technique.
Figure 12:
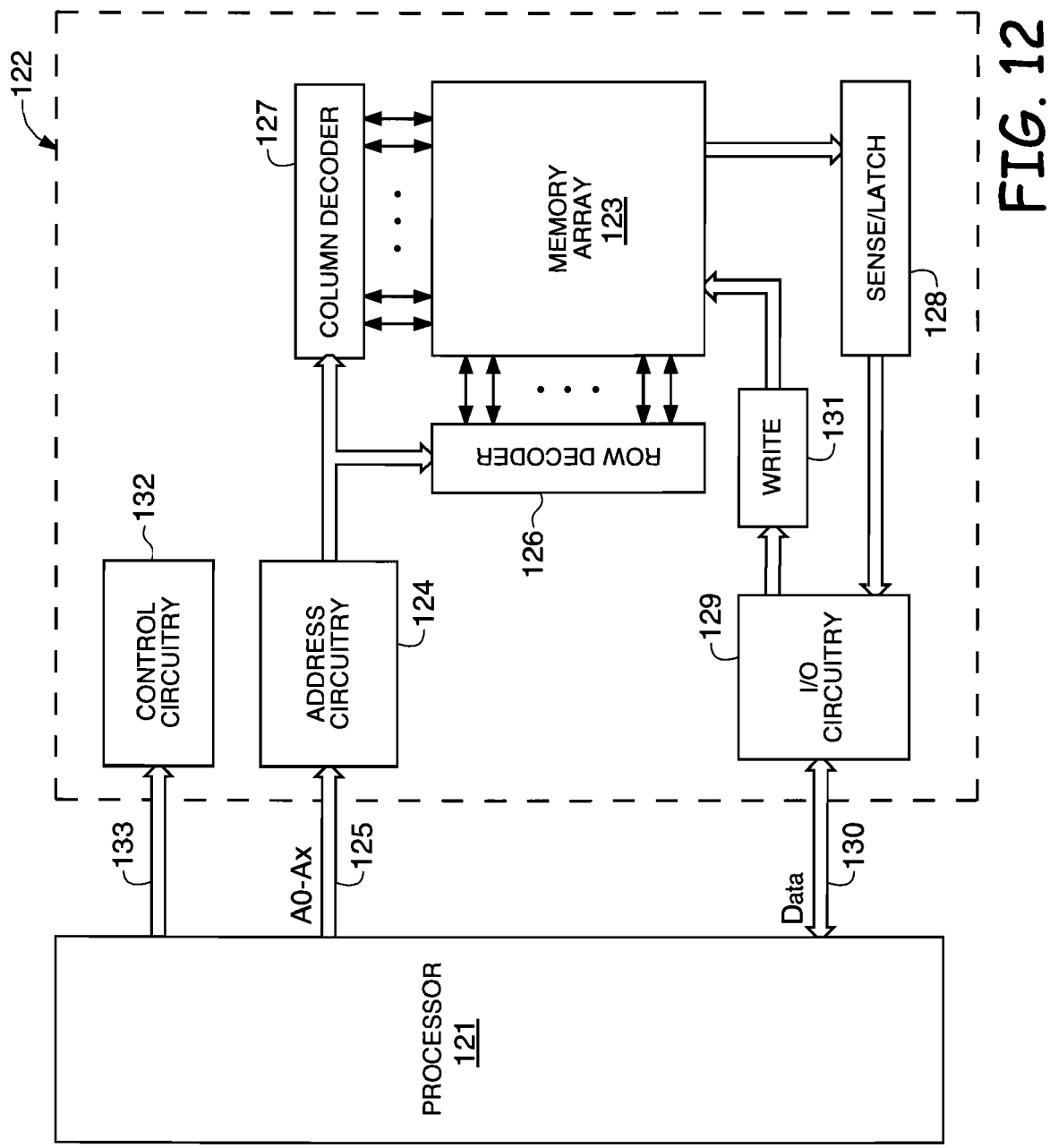
FIG. 12 is a simplified block diagram of a semiconductor system comprising a processor and a memory device to which the present invention may be applied.

Exemplary implementations of the present invention directed to processes for forming trench isolation between active devices in a semiconductor assembly, such as a flash memory device, are depicted in FIG. 2-11 and a general application of each exemplary implementation as depicted in FIG. 12.

A first exemplary implementation of the present invention is depicted in FIGS. 2 and 3. Referring now to the cross-sectional view of FIG. 2, a semiconductor substrate 20, such as a silicon substrate, is prepared for semiconductor device fabrication. Semiconductor substrate 20 is divided into an array section 21 and a periphery section 22. Array trenches 23 and periphery trenches 24 are etched into semiconductor substrate 20 by performing a dry etch process designed such that the side wall slope 25 at the base of the array trenches 23 is set such that a desired trench depth in the array section 21 and a desired trench depth in the periphery section 22 are obtained. The dry etch process is set so that the array trenches 23 will close the trench and thus form a desired trench depth in both the array section 21 and the periphery section 22 while maintaining the desired critical dimension (CD) of a given fabrication process.

FIG. 3 depicts the resulting trenches after an initial dry etch, known to one skilled in the art, is used to form the upper portion of the trenches having substantially vertical sidewalls by performing the initial dry etch dry etch process operated at 5-60 mTorr, 200-1000 W top RF power plasma etcher (to create plasma), 100-600 W bottom RF power (to create a bias voltage to direct ions to the substrate), using an etch chemistry of $HBr/Cl_2/CH_2F_2$, having a flow ratio of approximately 20:2:(0-2), applied in an RF plasma etcher, such as a Transformer Coupled Plasma (TCP) etcher chamber.

Next, a dry etch step of the present invention is performed to create the desired trench depth in array section 21 and periphery section 22 which also results in a desirable trench Δ depth 30 (the difference between depths of array trenches 23 and periphery trenches 24). As an example, in the first exemplary implementation of the present invention, the designed dry etch process was operated at 5-90 mTorr, 300-900 W top RF power plasma etcher (to create plasma), 100-500 W bottom RF power (to create a bias voltage to direct ions to the substrate), using an etch chemistry of $HBr/Cl_2/CH_2F_2$, having a flow ratio of approximately 12:2:(3-5), applied in an RF plasma etcher, such as a Transformer Coupled Plasma (TCP) etcher chamber.

In a preferred exemplary implementation of forming the v-shaped trench, the etch process comprises utilizing an RF plasma etcher operated at 30 mTorr +/−10 mTorr, 800 W+/−200 W top RF power, 300 W+/−100 W bottom RF power, using an etch chemistry of $HBr/Cl_2/CH_2F_2$ having a flow of HBr: 120 sccm +/−20 sccm, $Cl_2$: 25 sccm +/−10 sccm, $CH_2F_2$: 30 sccm +/−10 sccm. The preferred etch to form the v-shaped trench allows for various combinations of the etching parameters to achieve the desired result of a v-shaped trench, that becomes self-limiting as the base of the trench basically causes this etch to stop at the tip of the v-shaped trench (defined as the vortex of the v-shaped trench).

In the above example, a trench Δ depth 30 of approximately 2120 Å is obtained with an etching time of approximately 35-52 seconds. A main advantage provided by the designed etch is the fact that the trench Δ depth between the periphery and the array is controllable.

A major significance of obtaining a substantial trench Δ depth (2120 Å in this example, but again the Δ depth is controllable) will improve the electrical property in a neighboring periphery and array active device, as in the periphery the active device, having a thicker gate oxide (approximately 350 Å, compared to approximately 75 Å gate oxide thickness for the array active device), is activated by a high voltage of approximately 20V and thus requires better isolation, which is provided by the trench depth in the periphery as developed by the present invention.

Finally, as further depicted in FIG. 3, array trenches 23 and periphery trenches 24 are filled with an isolation material, such as an oxide that is planarized using techniques know to one skilled in the art, to form dual trench isolation comprising array trench isolation 31 and periphery trench isolation 32.

FIGS. 4-7 depict a second exemplary implementation of the present invention. Referring now to the cross-sectional view of FIG. 4, a semiconductor substrate 40, such as a silicon substrate, having an array section 41 and a periphery section 42 is depicted. A pad oxide 43 is formed on each substrate 40 in array section 41 and periphery section 42. The thickness of pad oxide 43 differs in the array section and the periphery section, which is a common occurrence resulting from conventional fabrication processes.

This exemplary implementation of the present invention takes advantage of the pad oxide thickness difference by first using a dry etch step to form array trenches 45 and periphery trenches 46 into polysilicon material 44. The etch stops in the array section before clearing the polysilicon material at the bottom of the array trenches 45, but clears the polysilicon material at the bottom of the periphery trench 46 and stops on pad oxide layer 43 in the periphery section. This etch is a conventional dry etch known to one skilled in the art, such as a general dry etch process operated at 5-50 mTorr, 300-900 W top RF power, 50-500 W bottom RF power, using an etch chemistry of $CF_4/He/CH_2F_2$ with a flow ratio of 2:4:(0-1) that is applied in an RF plasma etcher.

Referring now to FIG. 5, a second dry etch is performed to selectively etch oxide 43 at the bottom of periphery trench 46 while depositing a polymer 50 on the bottom polysilicon of array trench 45. Due to the generally anisotropic ion bombardment, polymer 50 is also deposited on the side walls of polysilicon surfaces 44 and along the side walls of oxide layer 43 of the trenches in periphery 42 section. A polymer 50 is also deposited on the sidewalls and on the bottom of array trenches 45 (regardless of whether the side walls are polysilicon or some other material) due to the anisotropic nature of the dry etch providing less ion bombardment along the side walls.

As an example, in the second exemplary implementation of the present invention the dry etch process was operated at 5-90 mTorr, 300-900 W top RF power, 100-500 W bottom RF power, using an etch chemistry of $O_2/He/CH_2F_2$ having a flow ratio of approximately 3:7:60, applied in an RF plasma etcher.

A following etch step in the second exemplary implementation could involve a plasma chemistry of high selectivity between silicon to oxide, which would stop on oxide layer 43 or etch very slowly through the oxide layer 43 in the array section 41 while etching into the silicon substrate much faster in trench 46 in the periphery section 42. This selective etch step would clear polymer 50 deposited earlier at the bottoms of both the array and periphery trenches. For example, in the array section, at array trench 45, the etch would clear polymer 50 from the bottom and then etch into polysilicon, but would stop or etch through the oxide layer 43 much slower then it etches the silicon substrate in the periphery section at periphery trench 46 (due to the chemistry etching silicon at a much higher rate than oxide). The side wall polymer 50 at both array and periphery would be consumed slowly since the dry etch process has a relatively lower etch rate in the lateral direction than in the vertical direction.

Referring now to FIG. 6, an effective dry etch process was operated at 5-90 mTorr, 300-900 W top RF power, 100-500 W bottom RF power, using an etch chemistry of $HBr/O_2/He$ having a flow rate of approximately 20:(0-3):5, applied in an RF plasma etcher. In this example, additional trench Δ depth 51 between periphery trench 46 and array trench 45 is obtained by two ways: the additional thickness of the thicker oxide layer 43 at periphery section 42 by selectively clearing the oxide before the etch continues into silicon substrate 40 at both array section 41 and periphery section 42; and/or by manipulating the selectivity of the dry etch chemistries of subsequent dry etch steps that would allow etching into silicon substrate 40 in periphery section 42 but would stop etching at oxide layer 43 in array section 41. Both methods would give controllable depth Δ between periphery trench 46 and array trench 45. In the later scenario, another two steps might be necessary to break through the oxide layer 43 at array section 41 and thus etch into the silicon substrate 40 to a desired depth for array trench 45 at array section 41.

FIG. 7 depicts the resulting trenches after the three step dry etch process of the second exemplary implementation of present invention is performed to create the desired trench depth in array section 41 and periphery section 42 which also results in a desirable trench Δ depth 51 (again, the difference between depth of array trenches 41 and periphery trenches 42). Finally, as further depicted in FIG. 7, array trenches 45 and periphery trenches 46 are filled with an isolation material, such as an oxide that is planarized using techniques know to one skilled in the art, to form dual trench isolation comprising array trench isolation 71 and periphery trench isolation 72.

FIGS. 8-11 depict a third exemplary implementation of the present invention. Referring now to the cross-sectional view of FIG. 8, a semiconductor substrate 80, such as a silicon substrate, having an array section 81 and a periphery section 82 is depicted. Array trenches 83 and periphery trench 84 are etched into silicon substrate 80 to a desired depth by a conventional dry etch step know to one skilled in the art.

Referring now to FIG. 9, a second dry etch is performed to increase the trench depth in both array section 81 and in periphery section 82, and in turn deposit a polymer 90 on the silicon surfaces of the trenches in both the array 81 and periphery 82 sections. Polymer 90 coats the sidewalls of array trenches 83 and the sidewalls of periphery trench 83. Polymer 90 also covers the bottom of array trenches 83, but does not coat the bottom of periphery trench 84, due to the respective narrow versus wide trench widths of the two sections. The polymer eventually closes off (blocks) the narrower array trenches while the etch continues to increase the depth of the wider periphery trenches.

As an example, in the third exemplary implementation of the present invention the designed dry etch process was operated at 5-90 mTorr, 300-900 W top RF power, 100-500 W bottom RF power, using an etch chemistry of $HBr/Cl_2/CH_2F_2$, having a flow ratio of approximately 12:2:(3-5), applied in an RF plasma etcher. In this example, trench Δ depth bias between the array and the periphery becomes controllable without the need of another mask step as the array trenches 83 will become pinched off with polymer 90 while the periphery trench 84 will continue to be etched deeper into silicon substrate 80.

FIG. 10 is a cross-sectional view following FIG. 9 showing a kink 100 that may be induced by the second dry etch step of FIG. 9. Kink 100 may appear in both the array section 81 and the periphery section 82 of FIG. 9. In order to address kink 100, a specific break-through etch step is performed to remove any remaining polymer 90 deposited in the bottom of the trenches and to remove the induced kink 100. As an example, the specific break-through etch step was operated at 5-90 mTorr, 300-900 W top RF power, 100-500 W bottom RF power, using an etch chemistry of $CF_4/He/NF_3$, having a flow ratio of approximately 10:12:(1-2), applied in an RF plasma etcher.

FIG. 11 is a cross-sectional view depicting the resulting array trenches 83 and periphery trench 84 after a specific break-through etch step was performed to remove any polymer remaining in the bottom of the trenches and to remove the induced kink 100 shown in FIG. 10. After the three step dry etch process of the third exemplary implementation of the present invention is performed to create the desired trench depth in array section 81 and periphery section 82, the process also results in a desirable trench Δ depth 110 (the difference between depth of array trenches 83 and periphery trenches 84). Finally, as further depicted in FIG. 11, array trenches 83 and periphery trenches 84 are filled with an isolation material, such as an oxide that is planarized using techniques know to one skilled in the art, to form dual trench isolation comprising array trench isolation 111 and periphery trench isolation 112.

In each exemplary implementation of the present invention, the approximation of the flow ratio of each etching chemistry may vary by 20 to 50%. Finally, in each exemplary implementation of the present invention, the semiconductor device is completed using conventional fabrication processes know to one skilled in the art.

FIG. 12 is a block diagram of a semiconductor flash memory device 122, representing a flash memory device comprising portions fabricated by the exemplary implementations of the present invention, which is coupled to a processor 121. The flash memory device 122 and the processor 121 may form part of an electronic system 120. The flash memory device 122 includes memory array 123 of non-volatile floating-gate memory cells arranged in banks of rows and columns. An address buffer circuit 124 is provided to latch address signals provided on address input connections $A_0$-$A_X$ 125. Address signals are received and decoded by row decoder 126 and column decoder 127 to access the memory array 123.

The flash memory device 122 reads data in the memory array 123 by sensing voltage or current changes in the memory array columns using sense/latch circuitry 128. Data input and output buffer circuitry 129 is included for bi-directional data communication over a plurality of data connections 130 with processor 121. Write circuitry 131 is provided to write data to memory array 123. Command control circuitry 132 decodes signals provided on control connections 133 from processor 121. These signals are used to control the operations of the flash memory device 122, including data read, data write and erase operations. The flash memory device illustrated has been simplified to facilitate a basis understanding thereof. A more detailed understanding of the internal circuitry and functions of flash memory devices are known to those skilled in the art.

It is to be understood that although the present invention has been described with reference to several preferred embodiments, various modifications, known to those skilled in the art, may be made to the process steps presented herein without departing from the invention as recited in the several claims appended hereto.

What is claimed is:

1. A fabrication process for forming dual depth trenches in a semiconductor memory device, the fabrication process comprising:
   performing a first dry etch step to etch an array trench and a periphery trench into a substrate to a depth;
   performing a second dry etch to increase the depth of the array trench and the depth of the periphery trench while depositing a polymer on sidewalls of the array trench and sidewalls of the periphery trench, the polymer covering a bottom of the array trench but not a bottom of the periphery trench, to create a trench depth difference between the array trench depth and the periphery trench depth; and
   performing a third etch step to remove any remaining polymer deposited in the bottom of the array trench, to remove any remaining polymer deposited on sidewalls of the periphery trench, and to remove any induced kinks from the sidewalls of the periphery trench.

2. The fabrication process as recited in claim 1, wherein the second dry etch step comprises utilizing an RF plasma etcher operated at 5-90 mTorr, 300-900 W top RF power, 100-500 W bottom RF power, using an etch chemistry of $HBr/Cl_2/CH_2F_2$ having a flow ratio of 12:2:(3-5).

3. The fabrication process as recited in claim 1, wherein the second dry etch step comprises utilizing an RF plasma etcher operated at 5-90 mTorr, 300-900 W top RF power, 100-500 W bottom RF power, using an etch chemistry of $HBr/Cl_2/CH_2F_2$.

4. The fabrication process as recited in claim 1, wherein the third dry etch step comprises utilizing an RF plasma etcher operated at 5-90 mTorr, 300-900 W top RF power, 100-500 W bottom RF power, using an etch chemistry of $CF_4/He/NF_3$.

5. The fabrication process as recited in claim 1, further comprising filling the array trench and the periphery trench with an isolation material.

6. A fabrication process for forming dual depth trenches, the fabrication process comprising:
performing a first dry etch to etch an array trench and a periphery trench into a semiconductor to a depth; and
performing a second dry etch to increase the depth of the array trench and the depth of the periphery trench while depositing a polymer on sidewalls of the array trench and sidewalls of the periphery trench, the polymer covering a bottom of the array trench but not a bottom of the periphery trench, to create a trench depth difference between the array trench depth and the periphery trench depth.

7. The fabrication process as recited in claim 6, further comprising performing a third etch to remove any remaining polymer deposited in the bottom of the array trench, to remove any remaining polymer deposited on sidewalls of the periphery trench, and to remove any induced kinks from the sidewalls of the periphery trench.

8. The fabrication process as recited in claim 6, wherein the second dry etch comprises utilizing an RF plasma etcher operated at 5-90 mTorr, 300-900 W top RF power, 100-500 W bottom RF power, using an etch chemistry of $HBr/Cl_2/CH_2F_2$.

9. A fabrication process for forming dual depth trenches, the fabrication process comprising: performing a dry etch to increase a depth of a periphery trench while depositing a polymer on sidewalls of an array trench and sidewalls of the periphery trench, wherein the polymer is deposited such that the polymer covers a bottom of the array trench but not a bottom of the periphery trench, to create a trench depth difference between the array trench depth and the periphery trench depth.

10. The fabrication process as recited in claim 9, wherein the dry etch comprises utilizing an RF plasma etcher operated at 5-90 mTorr, 300-900 W top RF power, 100-500 W bottom RF power, using an etch chemistry of $HBr/Cl_2/CH_2F_2$.

11. The fabrication process as recited in claim 9, wherein the dry etch comprises utilizing an RF plasma etcher operated at 5-90 mTorr, 300-900 W top RF power, 100-500 W bottom RF power, using an etch chemistry of $HBr/Cl_2/CH_2F_2$ having a flow ratio of 12:2:(3-5).

12. The fabrication process as recited in claim 9, wherein the dry etch comprises a second dry etch and further comprising:
forming a pad oxide over a semiconductor-based material, the pad oxide being thicker in a periphery section than in an array section; and
performing a first dry etch to form the array trench and the periphery trench in a silicon material formed over the pad oxide, the first dry etch stopping before clearing the silicon material at the bottom of the array trench and the first dry etch clearing the silicon material at the bottom of the periphery trench,
wherein the second dry etch selectively etches the pad oxide at the bottom of the periphery trench.

13. The fabrication process as recited in claim 12, further comprising performing a third dry etch to remove the polymer from the sidewalls of the array trench and the sidewalls of the periphery trench while etching into the semiconductor-based material to achieve the increased periphery trench depth, thus creating the trench depth difference between the array trench depth and the periphery trench depth.

14. The fabrication process as recited in claim 13, wherein the second dry etch comprises utilizing an RF plasma etcher operated at 5-90 mTorr, 300-900 W top RF power, 100-500 W bottom RF power, using an etch chemistry of $O_2/He/CH_2F_2$.

15. The fabrication process as recited in claim 13, wherein the third dry etch comprises utilizing an RF plasma etcher operated at 5-90 mTorr, 300-900 W top RF power, 100-500 W bottom RF power, using an etch chemistry of $HBr/O_2/He$.

16. The fabrication process as recited in claim 13, further comprising filling the array trench and the periphery trench with an isolation material.

17. The fabrication process as recited in claim 13, wherein the silicon material comprises polysilicon.

18. The fabrication process as recited in claim 13, wherein the first dry etch comprises utilizing a RF plasma etcher operated at 5-50 mTorr, 300-900 W top RF power, 50-500 W bottom RF power, using an etch chemistry of $CF_4/He/CH_2F_2$ with a flow ratio of 2:4:(0-1).

19. The fabrication process as recited in claim 13, wherein the third dry etch etches more slowly through the pad oxide in the array section than the semiconductor-based material in the periphery section and then etches into the semiconductor-based material in the array section to achieve a trench depth in the array section.

20. The fabrication process as recited in claim 13, wherein the first etch stops on the pad oxide in the periphery section.

21. A fabrication process for forming dual depth trenches, the fabrication process comprising:
performing a dry etch to etch an array trench and a periphery trench to a depth in a semiconductor-based material; and
performing a dry etch to increase the depth of the periphery trench while depositing a polymer on sidewalls of the array trench and sidewalls of the periphery trench, wherein the polymer is deposited such that the polymer covers a bottom of the array trench but not a bottom of the periphery trench, to create a trench depth difference between the array trench depth and the periphery trench depth.

22. The fabrication process as recited in claim 21, wherein the array trench comprises a plurality of array trenches and the periphery trench comprises a plurality of periphery trenches.

23. The fabrication process as recited in claim 21, further comprising performing an etch to remove the polymer covering the bottom of the array trench, to remove any remaining polymer deposited on sidewalls of the periphery trench, and to remove any induced kinks from the sidewalls of the periphery trench after performing the dry etch to increase the depth of the periphery trench.

24. The fabrication process as recited in claim 23, further comprising filling the array trench and the periphery trench with an isolation material.

25. The fabrication process as recited in claim 24, further comprising planarizing the isolation material.

26. The fabrication process as recited in claim 24, wherein filling the array trench and the periphery trench with an isolation material comprises filling the array trench and the periphery trench with an oxide.

27. The fabrication process as recited in claim 21, wherein the semiconductor-based material comprises a semiconductor substrate.

28. The fabrication process as recited in claim 27, wherein the semiconductor substrate comprises a silicon substrate.

29. The fabrication process as recited in claim 21, wherein the semiconductor-based material comprises a layer of silicon.

* * * * *